United States Patent
Cai et al.

(10) Patent No.: US 8,947,151 B2
(45) Date of Patent: Feb. 3, 2015

(54) FREQUENCY MIXING CIRCUIT AND METHOD FOR SUPPRESSING LOCAL OSCILLATION LEAKAGE IN FREQUENCY MIXING CIRCUIT

(71) Applicant: Huawei Technologies Co., Ltd., Shenzhen (CN)

(72) Inventors: Hua Cai, Chengdu (CN); Songlin Shuai, Chengdu (CN); Jia He, Chengdu (CN); Yong Zhang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/043,116

(22) Filed: Oct. 1, 2013

(65) Prior Publication Data

US 2014/0028372 A1 Jan. 30, 2014

Related U.S. Application Data

(63) Continuation of application No. PCT/CN2012/072243, filed on Mar. 13, 2012.

(30) Foreign Application Priority Data

Apr. 2, 2011 (CN) .......................... 2011 1 0083379

(51) Int. Cl.
*G06G 7/12* (2006.01)
*H03D 7/14* (2006.01)
(Continued)

(52) U.S. Cl.
CPC .............. *H03D 7/1491* (2013.01); *H03D 7/00* (2013.01); *H03D 7/18* (2013.01); *H04B 1/30* (2013.01); *H03D 2200/009* (2013.01); *H03D 2200/0045* (2013.01)
USPC ............................ 327/355; 455/317; 455/323

(58) Field of Classification Search
CPC .............. H03D 7/1441; H03D 7/1458; H03D 2200/009
USPC .................... 327/355; 455/205, 295, 317, 323
See application file for complete search history.

(56) References Cited

U.S. PATENT DOCUMENTS 3,870,960 A 3/1975 Hallford et al.
5,006,811 A 4/1991 Kruger
(Continued)

FOREIGN PATENT DOCUMENTS

| CN | 1248099 | 3/2000 |
|---|---|---|
| CN | 101202533 | 6/2008 |

(Continued)

OTHER PUBLICATIONS

PCT International Search Report and Written Opinion of the International Searching Authority dated Jun. 14, 2012 in corresponding International Patent Application No. PCT/CN2012/072243.
(Continued)

*Primary Examiner* — William Hernandez
(74) *Attorney, Agent, or Firm* — Staas & Halsey LLP

(57) ABSTRACT

Embodiments of the present invention disclose a frequency mixing circuit and a method for suppressing local oscillation leakage in the frequency mixing circuit, where a mixed input signal and a local oscillation signal are involved, and local oscillation leakage can be effectively reduced by using a frequency mixing circuit whose structure is simpler and is easier to be implemented. The frequency mixing circuit includes a direct current bias circuit, where the direct current bias circuit includes a direct current bias voltage source used for reducing a local oscillation current. The frequency mixing circuit is mainly applied to frequency mixing, and especially to a case where an intermediate frequency signal is mixed with a local oscillation signal to output a radio frequency signal.

5 Claims, 4 Drawing Sheets

(51) Int. Cl.
*H03D 7/00* (2006.01)
*H03D 7/18* (2006.01)
*H04B 1/30* (2006.01)

(56) References Cited

U.S. PATENT DOCUMENTS

| | | | |
|---|---|---|---|
| 5,086,512 | A | 2/1992 | Bartz |
| 5,732,343 | A | 3/1998 | Kim et al. |
| 6,167,247 | A | 12/2000 | Kannell et al. |
| 6,711,396 | B1 | 3/2004 | Bergsma et al. |
| 6,801,761 | B2 * | 10/2004 | Khorram ............ 455/326 |
| 7,280,805 | B2 * | 10/2007 | Xu et al. ............ 455/67.11 |
| 7,583,143 | B2 * | 9/2009 | Pan ............ 330/254 |
| 7,616,938 | B2 * | 11/2009 | Behzad et al. ............ 455/323 |
| 7,657,236 | B2 * | 2/2010 | Pan ............ 455/114.2 |
| 7,697,905 | B2 * | 4/2010 | Lee et al. ............ 455/114.2 |
| 7,734,259 | B2 * | 6/2010 | Pan ............ 455/114.2 |
| 2007/0042728 | A1 | 2/2007 | Pan |
| 2008/0200135 | A1 | 8/2008 | Chung |
| 2009/0149150 | A1 | 6/2009 | Buer et al. |

FOREIGN PATENT DOCUMENTS

| | | |
|---|---|---|
| CN | 201113924 | 9/2008 |
| CN | 101345537 | 1/2009 |
| CN | 101889390 | 11/2010 |
| EP | 0528848 | 1/1994 |

OTHER PUBLICATIONS

Chinese Office Action issued Dec. 5, 2012 in corresponding Chinese Application No. 201110083379.3.
Extended European Search Report, dated Dec. 16, 2013, in corresponding European Application No. 12767408.3 (7 pp.).
International Search Report mailed Jun. 14, 2012 in corresponding International Application No. PCT/CN2012/072243.

* cited by examiner

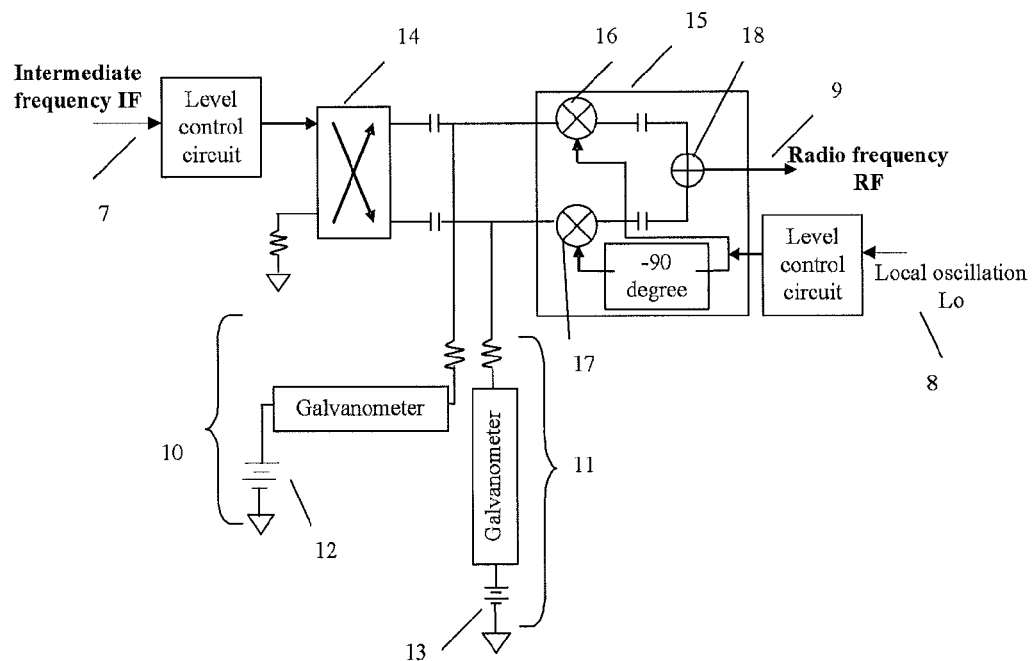

FIG. 7

```
┌─────────────────────────────────────────────┐
│ Calculate a voltage value of a direct current bias voltage │
│ source, where the voltage value of the direct current bias │──── 801
│ voltage source can make a value of a local oscillation │
│ current in a frequency mixing circuit smaller │
└─────────────────────────────────────────────┘
                      │
                      ▼
┌─────────────────────────────────────────────┐
│ Set a voltage value of a voltage source of a direct current │──── 802
│ bias circuit to the voltage value of the direct current bias │
│ voltage source, where the voltage value of the direct │
│ current bias voltage source is obtained through calculation │
│ and can make the value of the local oscillation current in │
│ the frequency mixing circuit smaller │
└─────────────────────────────────────────────┘
```

FREQUENCY MIXING CIRCUIT AND METHOD FOR SUPPRESSING LOCAL OSCILLATION LEAKAGE IN FREQUENCY MIXING CIRCUIT

CROSS-REFERENCE TO RELATED APPLICATIONS

This application is a continuation of International Application No. PCT/CN2012/072243, filed on Mar. 13, 2012, which claims priority to Chinese Patent Application No. 201110083379.3, filed on Apr. 2, 2011, both of which are hereby incorporated by reference in their entireties.

FIELD OF THE INVENTION

The present invention relates to a mixed input signal and a local oscillation signal, and in particular, to a frequency mixing circuit and a method for suppressing local oscillation leakage in the frequency mixing circuit.

BACKGROUND OF THE INVENTION

Frequency mixing, which is also called frequency conversion in terms of engineering, is a process of converting one value of a frequency of a signal into another value. A circuit that implements this frequency mixing function is called a frequency mixing circuit or frequency conversion circuit, and is also called a frequency mixer or frequency converter.

The frequency mixing circuit has been widely applied to communications engineering and wireless technologies. Generally, every wireless communications apparatus has a transmitter and a receiver, where the transmitter is configured to convert user data into a radio frequency signal for data transmission, and the receiver is configured to convert a received radio frequency signal into user data for data receiving.

The frequency mixing circuit plays an important role in transmitting/receiving a radio frequency signal, no matter in a transmitter or a receiver. In the transmitter, the frequency mixing circuit mixes an input signal (a baseband signal or an intermediate frequency signal) with a local oscillation signal to generate a to-be-transmitted radio frequency signal. In the receiver, the frequency mixing circuit mixes a radio frequency signal received by an antenna with a local oscillation signal to generate a baseband signal or an intermediate frequency signal.

The frequency mixing circuit is more widely applied especially in a superheterodyne receiver, for example, converting an amplitude-modulated 535 KHZ-1605 KHZ signal into a 465 KHZ intermediate frequency signal by an AM broadcast receiver, converting a modulated 48.5 M-870 M image signal into a 38 MHZ intermediate frequency image signal by a television receiver, and one intermediate frequency and double intermediate frequency in mobile communications.

A superheterodyne architecture is a main frequency-conversion manner of a current microwave transmitter, as shown in FIG. 1, which mixes information or an intermediate frequency modulation signal IF with a local oscillation signal Lo whose frequency is higher, and boosts a modulation signal carrier to a radio frequency RF.

A frequency of a signal carrier is converted from $f_{IF}$ to $f_{RF}$, and their relation may be $f_{RF}=f_{LO}+f_{IF}$ or $f_{RF}=f_{LO}-f_{IF}$. Due to nonlinearity of the frequency mixing circuit, frequency components of an output signal may be expressed as $f_{RF}=n*f_{LO}+m*f_{IF}$, where n and m are integers.

If $f_{RF}=f_{LO}+f_{IF}$ is taken as an output signal of the frequency mixing circuit, generally, in addition to this signal, a spurious signal $f_{LO}$ is further included at an RF outputting port of the frequency mixing circuit, that is, local oscillation leakage occurs.

To reduce the local oscillation leakage of the frequency mixing circuit, a filter may be used in the frequency mixing circuit. As shown in FIG. 2, by using frequency selectivity of the filter, a radio frequency signal can pass, and a local oscillation frequency is suppressed.

By adopting the foregoing solution to reduce the local oscillation leakage of the frequency mixing circuit, the filter needs to have better frequency selectivity, and the interconnection between the filter and a system is relatively complicated; and furthermore, performance of the filter is greatly affected by a process capability, so that implementability is poor. In addition, because the filter is an element that has frequency selectivity, and a frequency selectivity feature contradicts with wide area coverage of a frequency, this solution cannot satisfy a requirement of a broadband application of the frequency mixing circuit.

SUMMARY OF THE INVENTION

Embodiments of the present invention provide a frequency mixing circuit and a method for suppressing local oscillation leakage in the frequency mixing circuit, so as to effectively reduce local oscillation leakage by using a frequency mixing circuit whose structure is simpler and is easier to be implemented.

To achieve the foregoing objective, the embodiments of the present invention adopt the following technical solutions:

A frequency mixing circuit includes: a direct current bias circuit, where the direct current bias circuit includes a direct current bias voltage source used for reducing a local oscillation current.

A method for suppressing local oscillation leakage in a frequency mixing circuit, where the frequency mixing circuit includes a direct current bias circuit, and the method includes the following steps:

calculating a value of $V_b$ according to formulas $$\frac{d|f_{Lo}(a_1, a_2, \ldots, a_k, V_{Lo}, V_{IF}, V_b)|}{dV_b} = 0$$

and $$\frac{d^2|f_{Lo}(a_1, a_2, \ldots, a_k, V_{Lo}, V_{IF}, V_b)|}{d^2V_b} > 0,$$

where $V_b$ represents a voltage value of a direct current bias voltage source, $a_1, a_2, \ldots, a_k$ represent coefficients of voltage values in a relation between a current and a voltage across a nonlinear resistor, k represents a non-zero natural number, $V_{Lo}$ represents a voltage value of a local oscillation voltage source, $V_{IF}$ represents a voltage value of an intermediate frequency voltage source, and $f_{Lo}(a_1, a_2, \ldots, a_k, V_{Lo}, V_{IF}, V_b)$ represents a value of a local oscillation current; and setting a voltage value of a voltage source of the direct current bias circuit to $V_b$.

With the frequency mixing circuit and the method for suppressing local oscillation leakage in the frequency mixing circuit provided in the embodiments of the present invention, a direct current bias circuit that is simpler and is easier to be implemented is disposed in a frequency mixing circuit; when a voltage value of a bias voltage source of the direct current bias circuit changes, a value of a local oscillation current also changes correspondingly; and when the voltage value of the direct current bias voltage source is a certain specified value, the value of the local oscillation current can be decreased, thereby effectively reducing local oscillation leakage of the frequency mixing circuit.

BRIEF DESCRIPTION OF THE DRAWINGS

To illustrate the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

FIG. 7 is a structural diagram of another frequency mixing circuit according to an embodiment of the present invention;

FIG. 8 is a flow chart of a method for suppressing local oscillation leakage in a frequency mixing circuit according to an embodiment of the present invention.

DETAILED DESCRIPTION OF THE EMBODIMENTS

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by a person of ordinary skill in the art based on the embodiments of the present invention without creative efforts shall fall within the protection scope of the present invention.

Figure 1:
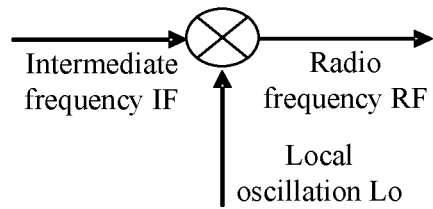
FIG. 1 is a schematic diagram of a superheterodyne architecture in the prior art.
Figure 2:
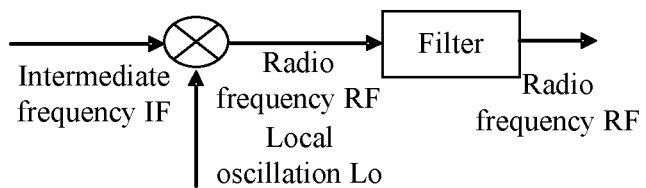
FIG. 2 is a schematic diagram of a structure for reducing local oscillation leakage of a frequency mixing circuit by using a filter.
Figure 3:
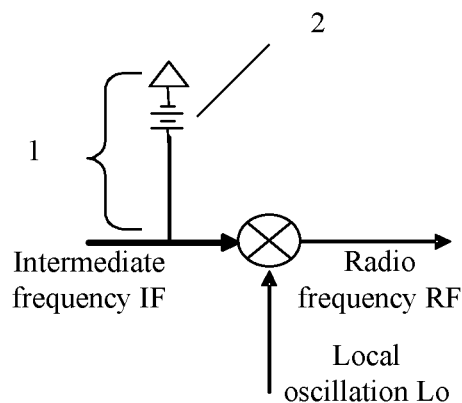
FIG. 3 is a structural diagram of a frequency mixing circuit according to an embodiment of the present invention.

An embodiment of the present invention provides a frequency mixing circuit, and as shown in FIG. 3, the frequency mixing circuit includes a direct current bias circuit 1, where the direct current bias circuit 1 includes a direct current bias voltage source 2 used for reducing a local oscillation current.

Figure 4:
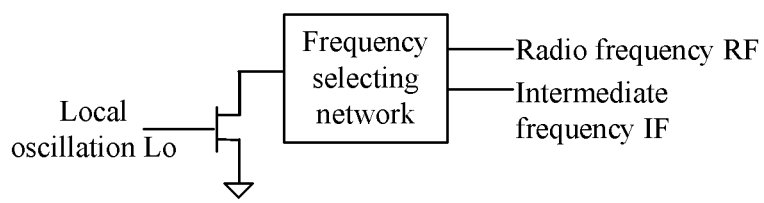
FIG. 4 is a diagram of a structure for implementing frequency mixing by using a field effect transistor FET.
Figure 5:
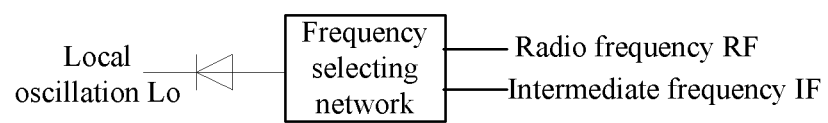
FIG. 5 is a diagram of a structure for implementing frequency mixing by using a diode.

This embodiment is applicable to a manner for implementing frequency mixing by using a field effect transistor FET shown in FIG. 4 and a manner for implementing frequency mixing by using a diode shown in FIG. 5.

The field effect transistor FET may be equivalent to a nonlinear resistor. A principle of the frequency mixing circuit shown in FIG. 3 is analyzed in the following. First, according to an existing method, structures shown in FIG. 4 and FIG. 5 may be equivalent to a circuit shown in FIG. 6.

Figure 6:
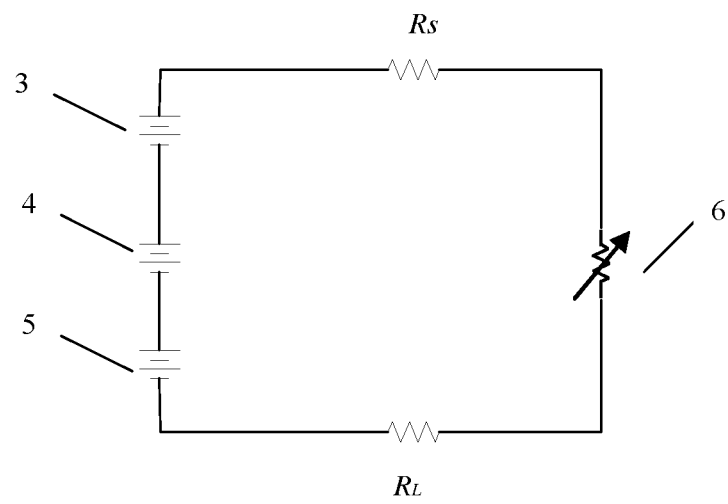
FIG. 6 is a principle diagram of the frequency mixing circuit shown in FIG. 3.

As shown in FIG. 6, the frequency mixing circuit includes a local oscillation voltage source 3, an intermediate frequency voltage source 4, a direct current bias voltage source 5, a nonlinear resistor 6, source impedance Rs for generating an excitation signal, and load impedance Rl.

It is assumed that a relation between a voltage and a current across the nonlinear resistor 6 satisfies the following relation:

$$I = \sum_{n=1}^{n=k} a_n V^n, k \le 7, \quad (1)$$

k≤7 (1), where I represents a current across the nonlinear resistor 6, V represents a voltage across the nonlinear resistor 6, and $a_n$ represents a coefficient that indicates a device feature.

A total loop voltage source Va=$V_{Lo}$*cos $w_{Lo}$t+$V_{IF}$*cos $w_{IF}$t+Vb (2), where Va represents a voltage value of the total loop voltage source and includes a direct voltage and an alternating voltage, $V_{Lo}$ represents a voltage value of the local oscillation voltage source 3, $V_{IF}$ represents a voltage value of the intermediate frequency voltage source 4, and $V_b$ represents a direct voltage value of the direct current bias voltage source 5.

Direct current values generated by the local oscillation voltage source 3, the intermediate frequency voltage source 4, and the direct current bias voltage source 5 may be obtained by substituting formula (2) to formula (1).

A direct current value generated by the direct current bias voltage source 5 is: $I_{dc}=f_{dc}(a_1, a_2, \ldots, a_k, V_{Lo}, V_{IF}, V_b)$, where $I_{dc}$ represents the direct current value generated by the direct current bias voltage source 5, and $a_1, a_2, \ldots, a_k$ represent coefficients of voltages across the nonlinear resistor 6 in formula (1).

A current generated by the local oscillation voltage source 3 is: $I_{Lo}=f_{Lo}(a_1, a_2, \ldots, a_k, V_{Lo}, V_{IF}, V_b)$.

Multiple different voltage values $V_b$ are set for the direct current bias voltage source 5, and $I_{dc}$, $V_{Lo}$, and $V_{IF}$ that correspond to each voltage value $V_b$ may be obtained through measurement. The coefficient $a_n$ in the expression of the nonlinear resistor 6 may be obtained by using a data-fitting method.

The obtained coefficient $a_n$ in the expression of the relation between the voltage and the current across the nonlinear resistor 6 is substituted to $f_{Lo}(a_1, a_2, \ldots, a_k, V_{Lo}, V_{IF}, V_b)$. A value of $V_b$ is calculated according to formulas $$\frac{d|f_{Lo}(a_1, a_2, \ldots, a_k, V_{Lo}, V_{IF}, V_b)|}{dV_b} = 0$$

and $$\frac{d^2|f_{Lo}(a_1, a_2, \ldots, a_k, V_{Lo}, V_{IF}, V_b)|}{d^2 V_b} > 0,$$

where the $V_b$ that is obtained through calculation can make a value of $|f_{Lo}|$ minimum. The $|f_{Lo}|$ is minimum, that is, the local oscillation current is minimum. If a voltage value of an external direct current bias voltage source is set to the foregoing $V_b$ that is obtained through calculation, suppression of the local oscillation leakage in the frequency mixing circuit can be implemented.

With the frequency mixing circuit provided in this embodiment, a direct current bias circuit that is simpler and is easier to be implemented is disposed; when a voltage value of a direct current bias voltage source changes, a value of a local oscillation current also changes correspondingly; and when the voltage value of the direct current bias voltage source is a certain specified value, the value of the local oscillation current can be reduced, thereby effectively reducing local oscillation leakage of the frequency mixing circuit.

As an implementation manner of this embodiment, the frequency mixing circuit provided in this embodiment is also applicable to a case where a radio frequency signal is mixed with a local oscillation signal to output an intermediate frequency signal.

As another implementation manner of this embodiment, the direct current bias circuit 1 may also be disposed on a local oscillation signal side or a radio frequency signal side.

As an improvement to this embodiment, an embodiment of the present invention provides another frequency mixing circuit. As shown in FIG. 7, the frequency mixing circuit may include an intermediate frequency inputting port 7 used for inputting an intermediate frequency (IF, Intermediate Frequency) signal, a local oscillation inputting port 8 used for inputting a local oscillation (Lo, Local Oscillation) signal, and a radio frequency outputting port 9 used for outputting a radio frequency (RF, Radio Frequency) signal.

A first direct current bias circuit 10 and a second direct current bias circuit 11 are disposed on the side of the intermediate frequency inputting port 7, where the first direct current bias circuit 10 includes a direct current bias voltage source 12 that is used for reducing a local oscillation current and is marked as Vb1, and the second direct current bias circuit 11 includes a direct current bias voltage source 13 that is used for reducing the local oscillation current and is marked as Vb2.

Because two direct current bias circuits are disposed, a problem of local oscillation leakage in the frequency mixing circuit can be effectively solved.

The frequency mixing circuit further includes: a 90-degree bridge 14 and an orthogonal frequency mixer 15, where the orthogonal frequency mixer 15 includes a first frequency mixing unit circuit 16, a second frequency mixing unit circuit 17, and a combiner 18.

An input signal passes through the 90-degree bridge 14 to generate a first input signal and a second input signal, where the first input signal and the second input signal are transferred to the first frequency mixing unit circuit 16 and the second frequency mixing unit circuit 17 of the orthogonal frequency mixer 15, respectively; and each of the first input signal and the second input signal is mixed with a local oscillation signal, and an output signal is generated after the mixed signals pass through the combiner 18.

The frequency mixing circuit in this embodiment is applicable to a manner for implementing frequency mixing by using a field effect transistor FET shown in FIG. 4, and is also applicable to a manner for implementing frequency mixing by using a diode shown in FIG. 5.

The field effect transistor FET may be equivalent to a nonlinear resistor. A principle of the frequency mixing circuit shown in FIG. 3 is analyzed in the following, as shown in FIG. 6.

It is assumed that a relation between a voltage and a current across a nonlinear resistor satisfies the following relation:

$$I = \sum_{n=1}^{n=k} a_n V^n, k \leq 7, \quad (1)$$

$k \leq 7$ (1), where I represents a current across the nonlinear resistor, V represents a voltage across the nonlinear resistor, and $a_n$ represents a coefficient that indicates a device feature. A total loop voltage source $Va = V_{Lo}*\cos w_{Lo}t + V_{IF}*\cos w_{IF}t + Vb$ (2), where Va represents a voltage value of the total loop voltage source, $V_{Lo}*\cos w_{Lo}t$ represents a voltage value of a local oscillation voltage source, $V_{IF}*\cos w_{IF}t$ represents a voltage value of an intermediate frequency voltage source, and Vb represents a voltage value of a direct current bias voltage source.

Current values generated by the local oscillation voltage source, the intermediate frequency voltage source, and the direct current bias voltage source may be obtained by substituting formula (2) to formula (1).

A current value generated by the direct current bias voltage source is: $I_{dc} = f_{dc}(a_1, a_2, \ldots, a_k, V_{Lo}, V_{IF}, V_b)$, where $I_{dc}$ represents the current value generated by the direct current bias voltage source, and $a_1, a_2, \ldots, a_k$ represent coefficients of voltages across the nonlinear resistor in formula (1).

A current generated by the local oscillation voltage source is: $I_{Lo} = f_{Lo}(a_1, a_2, \ldots, a_k, V_{Lo}, V_{IF}, V_b)$.

Multiple voltage values $V_b$ are set for the bias voltage source, and $I_{dc}$ that corresponds to each voltage value $V_b$ may be obtained through measurement. In combination with constants $V_{Lo}$ and $V_{IF}$, the coefficient $a_n$ in the expression of the nonlinear resistor may be obtained by using a data-fitting method.

The obtained coefficient $a_n$ in the expression of the nonlinear resistor is substituted to $f_{Lo}(a_1, a_2, \ldots, a_k, V_{Lo}, V_{IF}, V_b)$.

A value of $V_b$ is calculated according to formulas $$\frac{d|f_{Lo}(a_1, a_2, \ldots, a_k, V_{Lo}, V_{IF}, V_b)|}{dV_b} = 0$$

and $$\frac{d^2|f_{Lo}(a_1, a_2, \ldots, a_k, V_{Lo}, V_{IF}, V_b)|}{d^2 V_b} > 0,$$

where the $V_b$ that is obtained through calculation can make a value of $|f_{Lo}|$ minimum. The $|f_{Lo}|$ is minimum, that is, a local oscillation current is minimum. If a voltage value of an external direct current bias voltage source is set to the foregoing $V_b$ that is obtained through calculation, suppression of the local oscillation leakage in the frequency mixing circuit can be implemented.

With the frequency mixing circuit provided in this embodiment, a direct current bias circuit that is simpler and is easier to be implemented is disposed; when a voltage value of a bias voltage source of the direct current bias circuit changes, a value of a local oscillation current also changes correspondingly; and when the voltage value of the direct current bias voltage source is a certain specified value, the value of the local oscillation current can be reduced, thereby effectively reducing local oscillation leakage of the frequency mixing circuit.

The frequency mixing circuit is implemented by adopting the foregoing implementation manner, and suppression of an image frequency is implemented by adopting an orthogonal phase cancellation technology, so that single-sideband up conversion may be implemented.

As an improvement to this embodiment, to make input power of an intermediate frequency port and input power of a local oscillation port of the frequency mixing circuit to be constants, as shown in FIG. 7, a level control circuit may further be disposed at each of the intermediate frequency port and the local oscillation port of the frequency mixing circuit, where output power of the level control circuit is a constant.

The foregoing solution can make the input power of the intermediate frequency port and the input power of the local oscillation port of the frequency mixing circuit to be constants, thereby making a value of $V_{Lo}$ and a value of $V_{IF}$ to be constants.

To facilitate measurement, as another improvement to this embodiment, the direct current bias circuit may further include a galvanometer used for measuring a bias current of the direct current bias circuit, as shown in FIG. 7.

Temperature drift may cause change of an internal junction potential of a device, which is equivalent to that an additional voltage source that drifts with temperature is added to Vb. The voltage source is set to Voffset. If an offset voltage at normal temperature is maintained in a high or low temperature environment, an actual equivalent bias voltage is Vb+Voffset, which may affect the effect of suppressing local oscillation leakage in the case of temperature drift.

Because a relation among a direct current bias current I, a direct current bias voltage Vb, and a local oscillation current Ilo remains unchanged while Vb is a variable, only if I is constant, the local oscillation current can be stable, and the effect of suppressing local oscillation leakage can remain unchanged.

As shown in FIG. 7, the frequency mixing circuit includes two direct current bias circuits provided in the foregoing embodiment, which are marked as a first direct current bias circuit and a second direct current bias circuit. A bias voltage source in the first direct current bias circuit is marked as Vb1, and a bias voltage source in the second direct current bias circuit is marked as Vb2. Values of direct current bias currents of the first direct current bias circuit and the second direct current bias circuit at normal temperature are recorded as $I1_{normal}$ and $I2_{normal}$. When temperature deviates from the normal temperature, that is, the temperature becomes high or low, direct current bias voltages Vb1 and Vb2 are adjusted, and differences between currents actually measured in cases of high and low temperature and direct current bias currents at the normal temperature, that is, a difference between I1 and $I1_{normal}$ and a difference between I2 and $I2_{normal}$ are negatively fed back to drive the direct current bias voltages Vb1 and Vb2, so that the impact imposed on the effect of suppressing local oscillation leakage due to the change of high or low temperature is reduced.

It is assumed that a time step of an adjustment interval is u, u, that is, a coefficient updating step, may be preset as required, an error of a direct current bias current is error, and an expression of the error of the direct current bias circuit may be: error=I−$I_{normal}$ (4).

A feedback iterative formula of a direct current bias voltage is: $V_b(n)=V_b(n-1)+u*error$ (5).

That is, $V_b(n)=V_b(n-1)+u*(I-I_{normal})$, where $V_b(n)$ represents a voltage value of the direct current bias voltage source in an $n^{th}$ time period, $V_b(n-1)$ represents a voltage value of the direct current bias voltage source in an $(n-1)^{th}$ time period, u represents a coefficient updating step, I represents a bias current value measured in the $n^{th}$ time period, and $I_{normal}$ represents a bias current reference value.

As a preferred implementation manner of this embodiment, one capacitor may further be disposed between the 90-degree bridge and the first frequency mixing unit circuit, one capacitor may further be disposed between the 90-degree bridge and the second frequency mixing unit circuit, one capacitor may further be disposed between the first frequency mixing unit circuit and the combiner, and one capacitor may further be disposed between the second frequency mixing unit circuit and the combiner.

Coupling of direct currents between the first frequency mixing unit circuit and the second frequency mixing unit circuit that are orthogonal is avoided by using a feature that the capacitor can block a direct current.

To better suppress local oscillation leakage of the frequency mixing circuit, the first frequency mixing unit circuit and the second frequency mixing unit circuit may also be frequency mixers having the same resistivity.

The frequency mixing circuit in this embodiment may also be equivalent to the circuit shown in FIG. 6, and therefore, a value of a local oscillation current can be reduced, thereby effectively reducing the local oscillation leakage of the frequency mixing circuit.

With the frequency mixing circuit provided in this embodiment of the present invention, that a microwave filter is used at an outputting port of an up converter is avoided, and the difficulty of implementation is lowered, so that a frequency mixer may be monolithically integrated with another device. Furthermore, in the solution of this embodiment of the present invention, a device with better frequency selectivity is not used, thereby improving the frequency extension capability of the up converter.

An embodiment of the present invention provides a method for suppressing local oscillation leakage in a frequency mixing circuit, where the frequency mixing circuit includes a direct current bias circuit, and as shown in FIG. 8, the method includes the following steps:

801: Calculate a value of $V_b$ by using a computer program according to formulas $$\frac{d|f_{Lo}(a_1, a_2, \ldots, a_k, V_{Lo}, V_{IF}, V_b)|}{dV_b} = 0$$

and $$\frac{d^2|f_{Lo}(a_1, a_2, \ldots, a_k, V_{Lo}, V_{IF}, V_b)|}{d^2 V_b} > 0,$$

where $V_b$ represents a voltage value of a direct current bias voltage source, $a_1, a_2, \ldots, a_k$ represent coefficients of voltage values in a relation between a current and a voltage across a nonlinear resistor, k represents a non-zero natural number, $V_{Lo}$ represents a voltage value of a local oscillation voltage source, $V_{IF}$ represents a voltage value of an intermediate frequency voltage source, and $f_{Lo}$ represents a value of a local oscillation current.

802: Set a voltage value of a voltage source of the direct current bias circuit to $V_b$ by using a computer program.

With the method for suppressing local oscillation leakage in a frequency mixing circuit provided in this embodiment, a direct current bias circuit that is simpler and is easier to be implemented is disposed in the frequency mixing circuit; when a voltage value of a bias voltage source of the direct current bias circuit changes, a value of a local oscillation current also changes correspondingly; and when the voltage value of the direct current bias voltage source is a certain specified value, the value of the local oscillation current can be reduced, thereby effectively reducing local oscillation leakage of the frequency mixing circuit.

Figure 9:
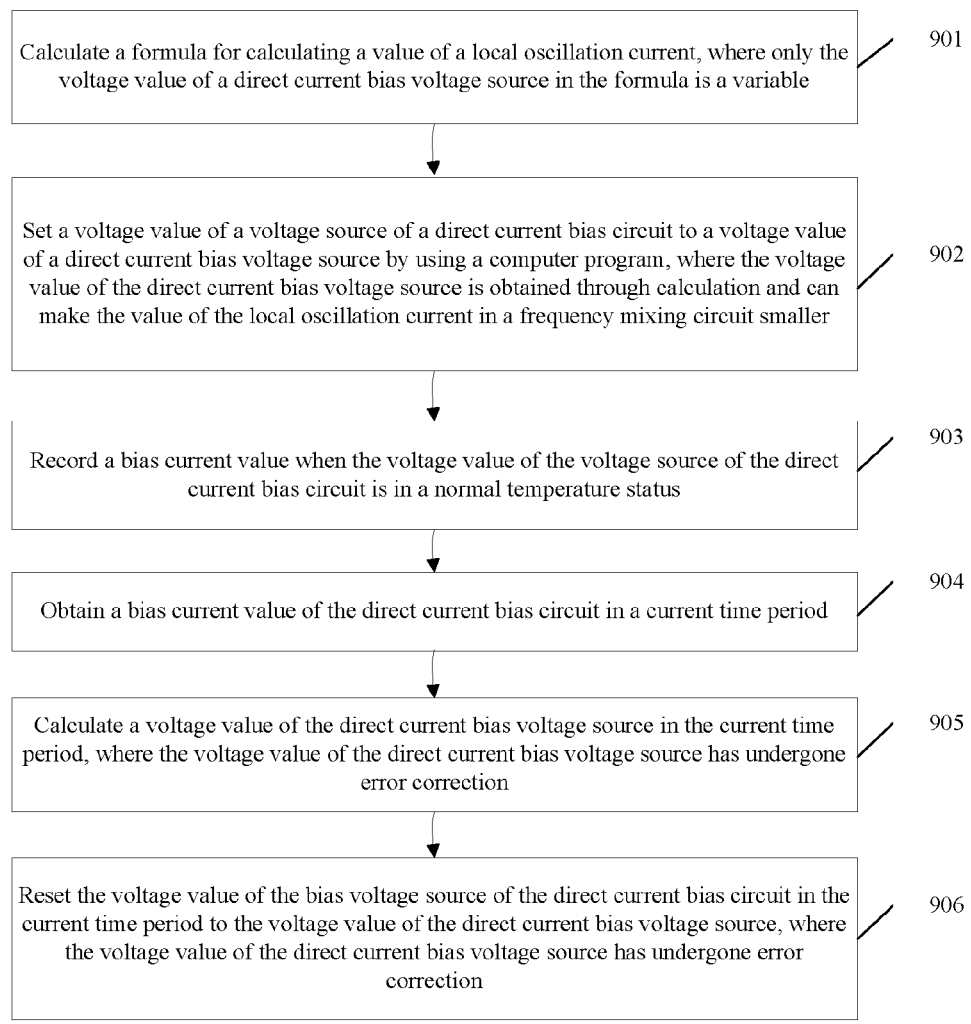
FIG. 9 is a flow chart of another method for suppressing local oscillation leakage in a frequency mixing circuit according to an embodiment of the present invention.

As an improvement to this embodiment, an embodiment of the present invention provides another method for suppressing local oscillation leakage in a frequency mixing circuit, where the frequency mixing circuit includes a direct current bias circuit, and as shown in FIG. 9, the method includes the following steps:

The frequency mixing circuit in this embodiment is applicable to a manner for implementing frequency mixing by using a field effect transistor FET, and is also applicable to a manner for implementing frequency mixing by using a diode.

The field effect transistor FET may be equivalent to a nonlinear resistor.

901: Calculate a formula for calculating a value of a local oscillation current, where only the voltage value $V_b$ of a direct current bias voltage source in the formula is a variable, that is, calculate $I_{Lo}=f_{Lo}(a_1, a_2, \ldots, a_k, V_{Lo}, V_{IF}, V_b)$.

It is assumed that a relation between a voltage and a current across the nonlinear resistor satisfies the following relation:

$$I = \sum_{n=1}^{n=k} a_n V^n, k \leq 7, \quad (1)$$

$k \leq 7$ (1), where I represents a current across the nonlinear resistor, V represents a voltage across the nonlinear resistor, and $a_n$ represents a preset coefficient.

A total loop voltage source $Va=V_{Lo}*\cos w_{Lo}t+V_{IF}*\cos w_{IF}t+Vb$ (2), where Va represents a voltage value of the total loop voltage source, $V_{Lo}*\cos w_{Lo}t$ represents a voltage value of a local oscillation voltage source, $V_{IF}*\cos w_{IF}t$ represents a voltage value of an intermediate frequency voltage source, and Vb represents a voltage value of a direct current bias voltage source.

Current values generated by the local oscillation voltage source, the intermediate frequency voltage source, and the direct current bias voltage source may be obtained by substituting formula (2) to formula (1).

A current value generated by the direct current bias voltage source is: $I_{dc}=f_{dc}(a_1, a_2, \ldots, a_k, V_{Lo}, V_{IF}, V_b)$, where $I_{dc}$ represents the current value generated by the direct current bias voltage source, and $a_1, a_2, \ldots, a_k$ represent coefficients of voltages across the nonlinear resistor in formula (1).

A current generated by the local oscillation voltage source is: $I_{Lo}=f_{Lo}(a_1, a_2, \ldots, a_k, V_{Lo}, V_{IF}, V_b)$.

Multiple voltage values $V_b$ are set for the bias voltage source, and $I_{dc}$, $I_{Lo}$, and $V_{IF}$ that correspond to each voltage value $V_b$ may be obtained through measurement. The coefficient $a_n$ in the expression of the nonlinear resistor may be obtained by using a data-fitting method.

The formula for calculating the value of the local oscillation current $I_{Lo}=f_{Lo}(a_1, a_2, \ldots, a_k, V_{Lo}, V_{IF}, V_b)$ may be obtained by substituting the obtained coefficient $a_n$ in the expression of the nonlinear resistor to $f_{Lo}(a_1, a_2, \ldots, a_k, V_{Lo}, V_{IF}, V_b)$. Only the voltage value $V_b$ of the direct current bias voltage source in the formula is a variable.

902: Calculate a value of $V_b$ according to formulas $$\frac{d|f_{Lo}(a_1, a_2, \ldots, a_k, V_{Lo}, V_{IF}, V_b)|}{dV_b} = 0$$

and $$\frac{d^2|f_{Lo}(a_1, a_2, \ldots, a_k, V_{Lo}, V_{IF}, V_b)|}{d^2 V_b} > 0,$$

where $V_b$ represents the voltage value of the direct current bias voltage source, $a_1, a_2, \ldots, a_k$ represent coefficients of voltage values in a relation between a current and a voltage across the nonlinear resistor, k represents a non-zero natural number, $V_{Lo}$ represents the voltage value of the local oscillation voltage source, $V_{IF}$ represents the voltage value of the intermediate frequency voltage source, and $f_{Lo}(a_1, a_2, \ldots, a_k, V_{Lo}, V_{IF}, V_b)$ represents the value of the local oscillation current.

This step may be implemented by using a computer program, a manual manner, or a single-chip microcomputer.

903: Record a bias current value $I_{normal}$ when the voltage value of the voltage source of the direct current bias circuit is set to $V_b$.

904: Obtain a bias current value I of the direct current bias circuit in a current time period.

905: Calculate $V_b(n)=V_b(n-1)+u*(I-I_{normal})$, where $V_b(n)$ represents a voltage value of the direct current bias voltage source in an $n^{th}$ time period, $V_b(n-1)$ represents a voltage value of the direct current bias voltage source in an $(n-1)^{th}$ time period, u represents a coefficient updating step, I represents a bias current value measured in the $n^{th}$ time period, and $I_{normal}$ represents a bias current reference value.

906: Reset the voltage value of the bias voltage source of the direct current bias circuit in the current time period to $V_b(n)$.

With the method for suppressing local oscillation leakage in a frequency mixing circuit provided in this embodiment, a direct current bias circuit that is simpler and is easier to be implemented is disposed in the frequency mixing circuit; when a voltage value of a bias voltage source of the direct current bias circuit changes, a value of a local oscillation current also changes correspondingly; and when the voltage value of the direct current bias voltage source is a certain specified value, the value of the local oscillation current can be reduced, thereby effectively reducing local oscillation leakage of the frequency mixing circuit.

Through the foregoing description of the embodiments, persons skilled in the art may clearly understand that the present invention may be implemented by software plus necessary universal hardware, and definitely may also be implemented by hardware, but in many cases, the software implementation manner is preferred. Based on such understanding, the technical solutions of the present invention essentially, or the part contributing to the prior art may be implemented in the form of a software product. The computer software product is stored in a readable storage medium, for example, a floppy disk, a hard disk, or an optical disk of a computer, and includes several instructions for instructing a computer device (which may be a personal computer, a server, a network device, and so on) to execute the methods described in the embodiments of the present invention.

The foregoing description is merely about exemplary embodiments of the present invention, but is not intended to limit the protection scope of the present invention. Any variation or replacement readily figured out by persons skilled in the art within the technical scope disclosed in the present invention shall all fall within the protection scope of the present invention. Therefore, the protection scope of the present invention shall be subject to the protection scope of the appended claims.

What is claimed is:

1. A frequency mixing circuit, comprising:
   a 90-degree bridge to pass through an input signal to generate a first input signal and a second input signal;
   an orthogonal frequency mixer, the orthogonal frequency mixer comprises:
      a first frequency mixing circuit to mix the generated first input signal with an oscillation signal of the first frequency mixing circuit,
      a second frequency mixing circuit to mix the generated second input signal with an oscillation signal of the second frequency mixing circuit, and a combiner passing through mixed signals of the first and second frequency mixing circuits to generate an output signal;

a first direct current bias circuit disposed at an intermediate frequency input port of the first frequency mixing circuit;

a second direct current bias circuit disposed at an intermediate frequency input port of the second frequency mixing circuit; and level control circuits disposed at intermediate frequency input ports and oscillation input ports of the first and second frequency mixing circuits to make input power of the intermediate frequency input ports and input power of the oscillation input ports of the first and second frequency mixing circuits to be constants.

2. The frequency mixing circuit according to claim 1, wherein the frequency mixing circuit further comprises a radio frequency outputting port; and the first and second direct current bias circuits are disposed at the intermediate frequency input port side, or the oscillation input port side, or the radio frequency outputting port side.

3. The frequency mixing circuit according to claim 1, wherein the first and/or second direct current bias circuits further comprise a galvanometer used for measuring a bias current of the first and/or second direct current bias circuits.

4. The frequency mixing circuit according to claim 1, wherein a capacitor is disposed between the 90-degree bridge and the first frequency mixing circuit, a capacitor is disposed between the 90-degree bridge and the second frequency mixing circuit, a capacitor is disposed between the first frequency mixing circuit and the combiner, and a capacitor is disposed between the second frequency mixing circuit and the combiner.

5. The frequency mixing circuit according to claim 1, wherein the first frequency mixing circuit and the second frequency mixing circuit are frequency mixers having similar resistivity.

* * * * *